(12) United States Patent
Tung et al.

(10) Patent No.: US 8,717,248 B2
(45) Date of Patent: May 6, 2014

(54) ELECTRONIC DEVICE FOR PROCESSING RADIO FREQUENCY SIGNALS AND MATCHING CIRCUIT FOR PROVIDING VARIABLE IMPEDANCE

(75) Inventors: Wei-Shin Tung, Taoyuan County (TW); Yu-Meng Yen, Taoyuan County (TW); Pei-Zong Rao, Taoyuan County (TW); Wan-Ming Chen, Taoyuan County (TW)

(73) Assignee: HTC Corporation, Taoyuan (TW)

( * ) Notice: Subject to any disclaimer, the term of this patent is extended or adjusted under 35 U.S.C. 154(b) by 363 days.

(21) Appl. No.: 13/282,134

(22) Filed: Oct. 26, 2011

(65) Prior Publication Data
US 2013/0106672 A1 May 2, 2013

(51) Int. Cl.
*H01Q 1/50* (2006.01)
(52) U.S. Cl.
USPC .............................. 343/860; 343/861; 333/32
(58) Field of Classification Search
USPC ........... 343/702, 850, 860, 861; 333/17.3, 32; 455/77
See application file for complete search history.

(56) References Cited

U.S. PATENT DOCUMENTS

| | | | | |
|---|---|---|---|---|
| 5,874,926 A * | 2/1999 | Tsuru et al. | ................... | 343/860 |
| 2008/0252549 A1* | 10/2008 | Ohtaki et al. | ................. | 343/861 |
| 2010/0056075 A1* | 3/2010 | Rakshani et al. | ............... | 455/77 |
| 2013/0063223 A1* | 3/2013 | See et al. | ........................ | 333/32 |
| 2013/0099993 A1* | 4/2013 | Tung et al. | .................... | 343/861 |
| 2013/0187712 A1* | 7/2013 | Cabanillas et al. | ........... | 330/192 |

* cited by examiner

*Primary Examiner* — Tan Ho
(74) *Attorney, Agent, or Firm* — Birch, Stewart, Kolasch & Birch, LLP

(57) ABSTRACT

An electronic device for processing radio frequency signals includes an antenna, an RF circuit, and a matching circuit. The matching circuit provides variable impedance between the antenna and the RF circuit. The antenna is capable of operating in a first frequency band or a second frequency band according to the variable impedance The matching circuit includes a first element; a second element; a first tuning cell connected to the first element and the second element, and comprising a first tuning element, a second tuning element and a first control element, the first control element determining whether to make a first node connected between the first and second tuning elements couple to a voltage level according to a first control signal; and a selecting circuit coupled to the first control element and configured to generate the first control signal so as to adjust the variable impedance.

25 Claims, 5 Drawing Sheets

ELECTRONIC DEVICE FOR PROCESSING RADIO FREQUENCY SIGNALS AND MATCHING CIRCUIT FOR PROVIDING VARIABLE IMPEDANCE

BACKGROUND OF THE INVENTION

1. Field of the Invention

The disclosure generally relates to an electronic device and a matching circuit, and more particularly, relates to an electronic device for processing radio frequency (RF) signals and a matching circuit for providing variable impedance.

2. Description of the Related Art

Compact portable devices usually have smaller antennas, resulting in poor antenna performance and OTA (Over-The-Air) performance. There are two main methods to solve the problem. One is to enhance antenna efficiency, and the other is to increase antenna bandwidth.

FIG. 1 is a diagram illustrating a traditional matching circuit 100 with variable impedance. As shown in FIG. 1, an antenna 102 is coupled to the matching circuit 100, which includes inductors 104, 110 and variable capacitors 106, 108. With different capacitances, the variable capacitors 106, 108 are the primary tuning elements to increase the antenna bandwidth. Different capacitances can be obtained according to controlled voltages of the variable capacitors 106, 108. However, the impedance of the matching circuit 100 cannot be tuned by the inductors 104, 110, such that freedom of design is limited.

BRIEF SUMMARY OF THE INVENTION

In one exemplary embodiment, the disclosure is directed to an electronic device for processing radio frequency (RF) signals, which comprises an antenna, an RF circuit, and a matching circuit configured to provide variable impedance between the antenna and the RF circuit, wherein the antenna is capable of operating in a first frequency band or a second frequency band according to the variable impedance. The matching circuit comprises a first element having a first terminal and a second terminal, wherein the first terminal is coupled to the antenna; a second element having a third terminal connected to the second terminal of the first element and a fourth terminal coupled to the RF circuit; a first tuning cell connected to the second terminal of the first element and the third terminal of the second element. The first tuning cell comprises a first tuning element, a second tuning element and a first control element, wherein the first control element determines whether to make a first node connected between the first and second tuning elements couple to a voltage level according to a first control signal; and a selecting circuit coupled to the first control element and configured to generate the first control signal so as to adjust the variable impedance.

In another exemplary embodiment, the disclosure is directed to a matching circuit configured to provide variable impedance between an antenna and a RF circuit. The matching circuit comprises a first element having a first terminal and a second terminal, wherein the first terminal is coupled to the antenna; a second element having a third terminal connected to the second terminal of the first element and a fourth terminal coupled to the RF circuit; a first tuning cell connected to the second terminal of the first element and the third terminal of the second element. The first tuning cell comprises a first tuning element, a second tuning element and a first control element, wherein the first control element determines whether to make a first node connected between the first and second tuning elements couple to a voltage level according to a first control signal; and a selecting circuit coupled to the first control element and configured to generate the first control signal so as to adjust the variable impedance.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
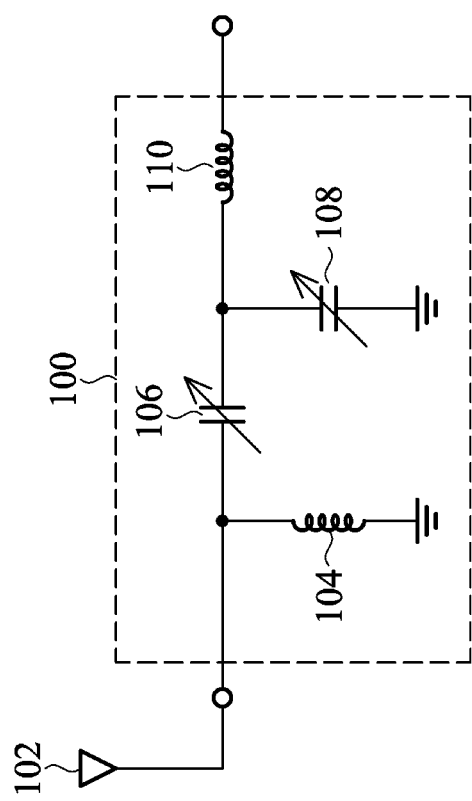
FIG. 1 is a diagram illustrating a traditional matching circuit with variable impedance.
Figure 2A:
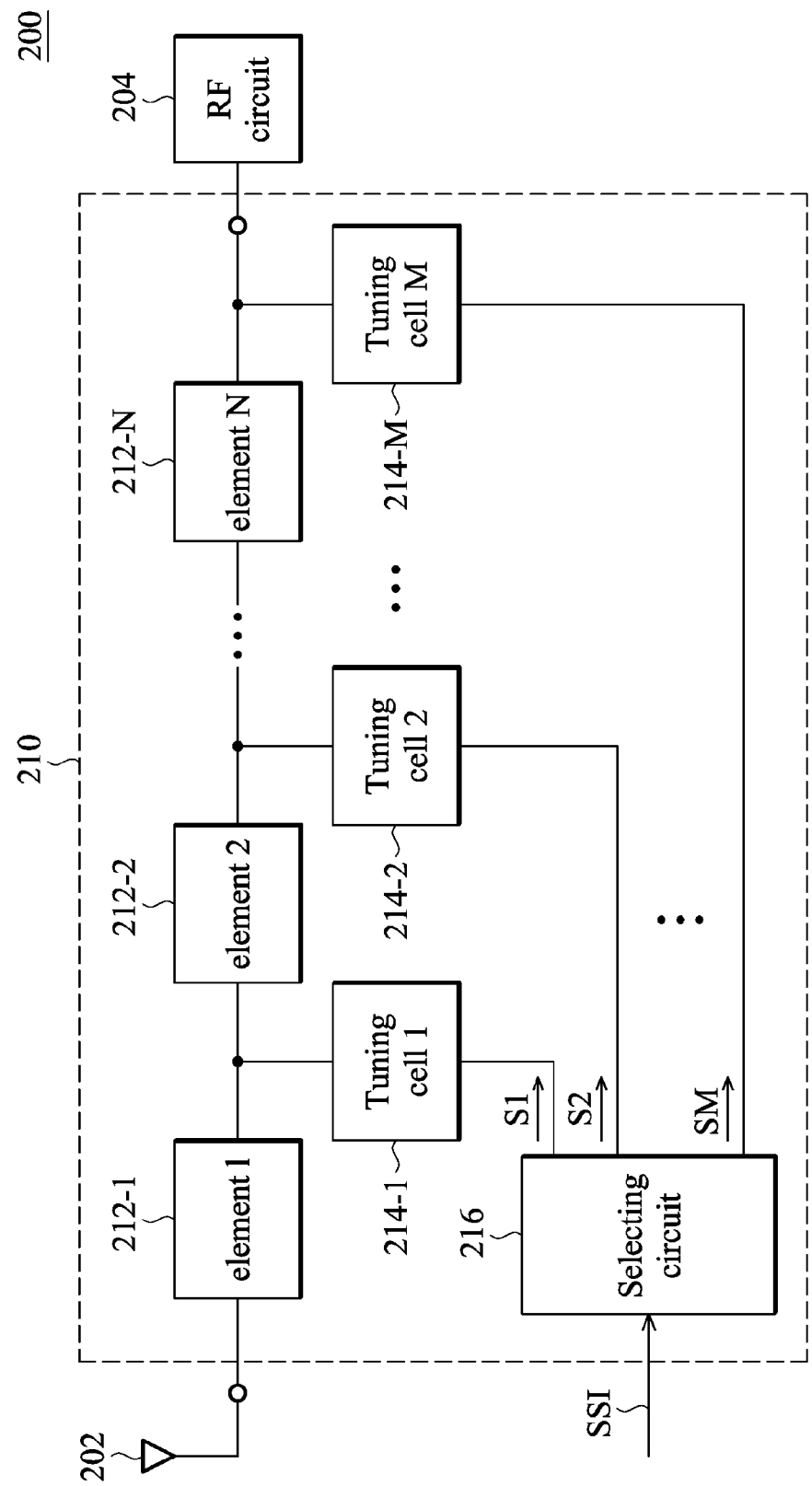
FIG. 2A is a diagram illustrating an electronic device according to an embodiment of the invention.

FIG. 2A is a diagram illustrating an electronic device 200 according to an embodiment of the invention. As shown in FIG. 2A, the electronic device 200 comprises an antenna 202, an RF circuit 204, and a matching circuit 210. The matching circuit 210 is electrically connected between the antenna 202 and the RF circuit 204, and comprises a plurality of elements 212-1, 212-2, ..., 212-N, one or more tuning cells 214-1, 214-2, ..., 214-M, and a selecting circuit 216, wherein N is an integer which is greater than or equal to 2, M is an integer which is greater than or equal to 1, and N is greater than or equal to M. Each of the plurality of elements 212-1, 212-2, ..., 212-N may comprise one or more electronic components, such as capacitors, inductors, or resistors. The selecting circuit 216 may transmit one or more control signals S1, S2, ..., SM according to a setting signal SSI or a default value so as to adjust impedances of the one or more tuning cells 214-1, 214-2, ..., 214-M, respectively. Therefore, the matching circuit 210 can provide variable impedance between the antenna 202 and the RF circuit 204. It is noted that each of the one or more control signals S1, S2, ..., SM may comprise one or more sub-signals. For example, the control signal S1 may comprise sub-signals S1-1, S1-2. The antenna can be operated in a plurality of frequency bands, such as 3G, LTE (Long Term Evolution), DCS (Distributed Control System) Band, or WCDMA (Wideband Code Division Multiple Access) BC1, according to the variable impedance of the matching circuit 210.

Figure 2B:
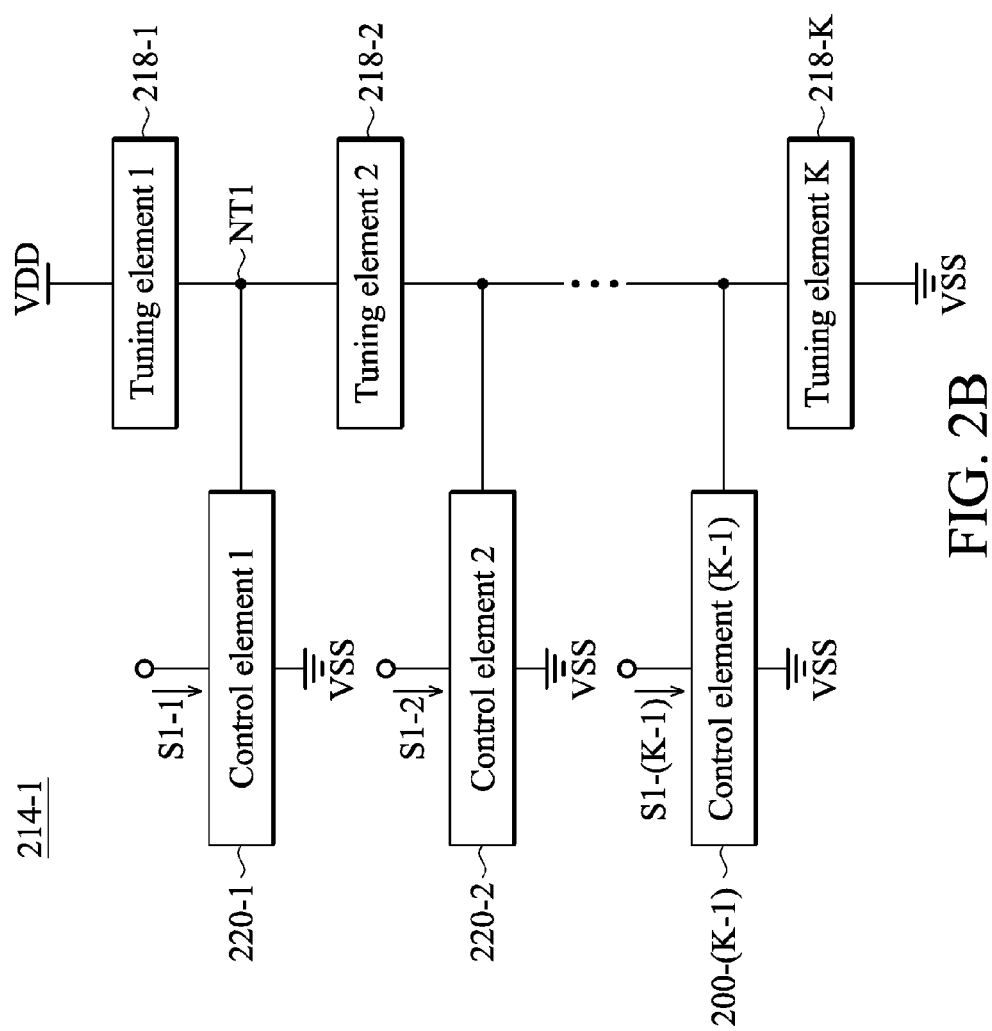
FIG. 2B is a diagram illustrating a tuning cell according to an embodiment of the invention.

FIG. 2B is a diagram illustrating the tuning cell 214-1 according to an embodiment of the invention. As shown in FIG. 2B, the tuning cell 214-1 comprises a plurality of tuning elements 218-1, 218-2, ..., 218-K and one or more control elements 220-1, 220-2, ..., 220-(K−1), wherein K is an integer that is greater than or equal to 2. The plurality of tuning elements 218-1, 218-2, ..., 218-K and the one or more control elements 220-1, 220-2, ..., 220-(K−1) are electrically coupled between a ground voltage VSS (e.g., 0V) and a work voltage VDD (e.g., 1.8V or 3V). It is noted that each of the other tuning cells 214-2, ..., 214-M may comprise the same components as those of the tuning cell 241-1. The control signal S1, generated by the selecting circuit 216, comprises one or more sub-signals S1-1, S1-2, ..., S1-(K−1) for controlling the one or more control elements 220-1, 220-2, ..., 220-(K−1), respectively. For example, the control element 220-1 determines whether to make a node NT1, which is electrically connected between the tuning elements 218-1, 218-2, electrically connect to the ground voltage VSS according to the sub-signal S1-1. The control element 220-1 may be a switch or a diode. In one embodiment of the invention, if the sub-signal S1-1 is equal to the work voltage VDD, the control element 220-1 electrically connects the node NT1 to the ground voltage VSS, and if the sub-signal S1-1 is equal to the ground voltage VSS, the control element 220-1 does not electrically connect the node NT1 to the ground voltage VSS or opens the node NT1. The other control elements 220-2, ..., 220-(K−1) may have similar features to that of the control element 220-1, so they will not be described again.

Figure 3:
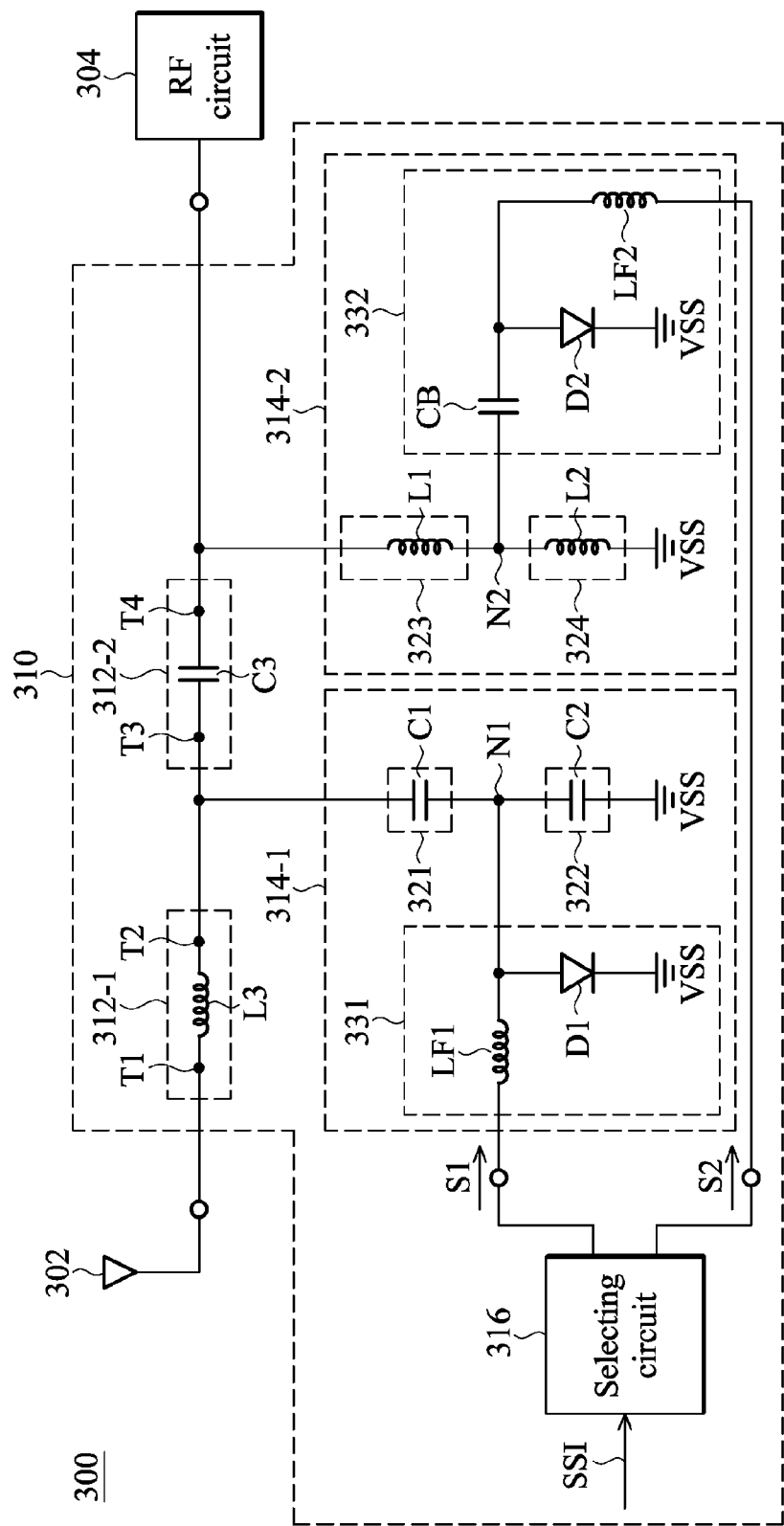
FIG. 3 is a diagram illustrating an electronic device according to an embodiment of the invention.

FIG. 3 is a diagram illustrating an electronic device 300 according to another embodiment of the invention. As shown in FIG. 3, the electronic device 300 comprises an antenna 302, an RF circuit 304, and a matching circuit 310.

The matching circuit 310 is configured to provide variable impedance between the antenna 302 and the RF circuit 304. The antenna 302 is capable of operating in at least a frequency band F1 or a frequency band F2 according to the variable impedance provided by the matching circuit 310. The matching circuit 310 comprises at least two elements 312-1, 312-2, at least one tuning cell 314-1, and a selecting circuit 316. The elements 312-1, 312-2 are electrically coupled between the antenna 302 and the RF circuit 304. The element 312-1 has two terminals T1 and T2, wherein the terminal T1 is coupled to the antenna 302. The element 312-2 has two terminals T3 and T4, wherein the terminal T3 is electrically connected to the terminal T2, and the terminal T4 is coupled to the RF circuit 304. Each of the elements 312-1, 312-2 may comprise one or more electronic components, such as capacitors, inductors, or resistors. The tuning cell 314-1 is electrically connected to the terminal T2 of elements 312-1 and the terminal T3 of the element 312-2, and comprises at least two tuning elements 321 and 322 and at least one control element 331. The control element 331 determines whether to make a node N1, which is electrically connected between the tuning elements 321 and 322, couple to a voltage level according to a control signal S1. In an embodiment, the voltage level is the ground voltage VSS. The selecting circuit 316 is configured to generate at least the control signal S1 according to a setting signal SSI or a default value so as to adjust the variable impedance of the matching circuit 310.

In some embodiments, the tuning elements 321 and 322 are two capacitors C1 and C2. The control element 331 comprises an RF chock inductor LF1 and a diode D1. The RF chock inductor LF1 is electrically connected to the node N1 and receives the control signal S1. Inductance of the RF chock inductor LF1 is greater than 33 nH, such as 56 nH, so as to block signals in high frequency bands. The diode D1 has an anode electrically connected to the node N1 and a cathode electrically connected to the voltage level. In an embodiment, the voltage level is the ground voltage VSS.

In another embodiment, the matching circuit 310 may further comprise another tuning cell 314-2 which is electrically connected to the terminal T4 of the element 312-2 and the RF circuit 304. Similarly, the tuning cell 314-2 comprises at least two tuning elements 323 and 324 and at least one control element 332. The control element 332 determines whether to make a node N2, which is electrically connected between the tuning elements 323 and 324, couple to the voltage level according to another control signal S2. In an embodiment, the voltage level is the ground voltage VSS. The selecting circuit 316 is further configured to generate the control signal S2 according to the setting signal SSI or the default value so as to adjust the variable impedance of the matching circuit 310.

In some embodiments, the tuning elements 323 and 324 are two inductors L1 and L2. The control element 332 comprises an RF chock inductor LF2, a diode D2, and a blocking capacitor CB. The RF chock inductor LF2 is coupled to the node N2 and receives the control signal S2. Inductance of the RF chock inductor LF2 is greater than 33 nH, such as 56 nH, so as to block signals in high frequency bands. The diode D2 has an anode coupled to the node N2 and a cathode electrically connected to the voltage level. In an embodiment, the voltage level is the ground voltage VSS. The blocking capacitor CB has one terminal connected to the node N2 and the other terminal connected to the RF chock inductor LF2 and the anode of the diode D2 so as to block DC signals.

The elements 312-1 may be an inductor L3, and the element 312-2 may be a capacitor C3.

It is noted that the tuning cells 314-1, 314-2 can be swapped with each other. In other words, the tuning cells 314-1 may be electrically connected to the element 312-2 and the RF circuit 304, and the tuning cell 314-2 may be electrically connected to the elements 312-1, 312-2. The matching circuit 310 may also comprise the same two tuning cells; that is, the tuning cell 314-1 is replaced with another tuning cell 314-2 or the tuning cell 314-2 is replaced with another tuning cell 314-1, so that the two tuning cells are identical.

In one embodiment of the invention, if the control signal S1 generated by the selecting circuit 316 is equal to the work voltage VDD, the diode D1 is turned on so as to electrically connect the node N1 to the ground voltage VSS, and if the control signal S1 is equal to the ground voltage VSS, the diode D1 is turned off so as not to electrically connect the node N1 to the ground voltage VSS. Similarly, if the control signal S2 generated by the selecting circuit 316 is equal to the work voltage VDD, the diode D2 is turned on (closed); and if the control signal S2 is equal to the ground voltage VSS, the diode D2 is turned off (open).

Figure 4:
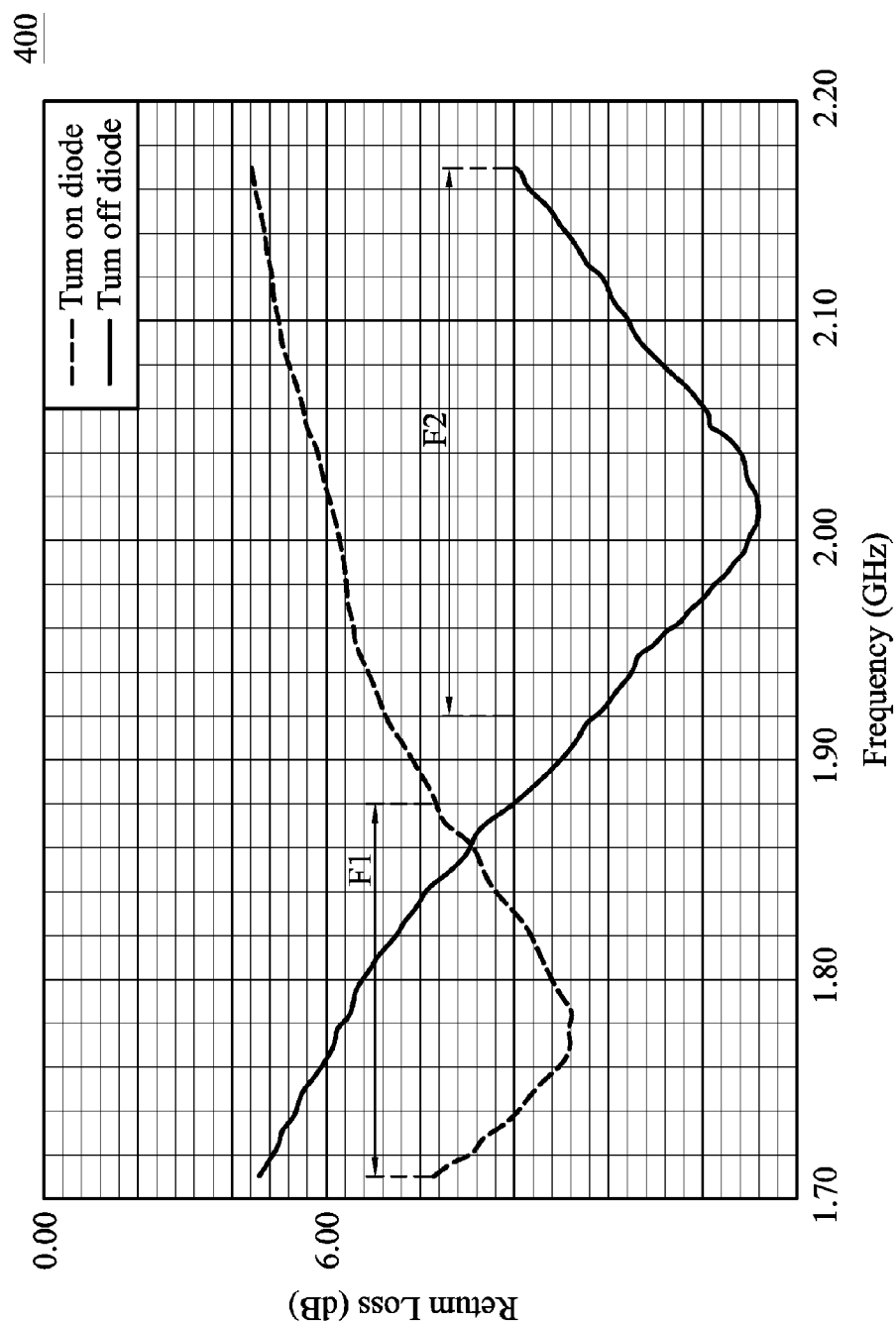
FIG. 4 is a diagram illustrating return loss of an antenna according to an embodiment of the invention.

FIG. 4 is a diagram 400 illustrating return loss of the antenna 302 according to an embodiment of the invention. FIG. 4 is utilized for illustrating measured return loss (unit: dB) over frequency (unit: GHz). If the control signals S1, S2 are both equal to the work voltage VDD, the diodes D1, D2 are both turned on, and the matching circuit 310 can provide first impedance so that the antenna 302 is operated in the frequency band F1, DCS Band, which is approximately from 1.71 GHz to 1.88 GHz. On the other hand, if the control signals S1, S2 are both equal to the ground voltage VSS, the diodes D1, D2 are both turned off, and the matching circuit 310 can provide a second impedance so that the antenna 302 is operated in the frequency band F2, WCDMA BC1, which is approximately from 1.92 GHz to 2.17 GHz.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device for processing radio frequency (RF) signals, comprising:
   an antenna;
   an RF circuit; and
   a matching circuit configured to provide variable impedance between the antenna and the RF circuit, wherein the antenna is capable of operating in a first frequency band or a second frequency band according to the variable impedance, and comprising:
      a first element having a first terminal and a second terminal, wherein the first terminal is coupled to the antenna;
      a second element having a third terminal connected to the second terminal of the first element and a fourth terminal coupled to the RF circuit;
      a first tuning cell connected to the second terminal of the first element and the third terminal of the second element, and comprising a first tuning element, a second tuning element and a first control element, wherein the first control element determines whether to make a first node connected between the first and second tuning elements couple to a voltage level according to a first control signal; and
      a selecting circuit coupled to the first control element and configured to generate the first control signal so as to adjust the variable impedance.

2. The electronic device as claimed in claim 1, wherein the first and second tuning elements are capacitors.

3. The electronic device as claimed in claim 1, wherein the first control element comprises:
   a first RF chock inductor coupled to the first node and receiving the first control signal; and
   a first diode having a first anode coupled to the first node and a first cathode coupled to the voltage level.

4. The electronic device as claimed in claim 3, wherein inductance of the first RF chock inductor is greater than 33 nH.

5. The electronic device as claimed in claim 1, wherein the voltage level is a ground voltage.

6. The electronic device as claimed in claim 1, wherein the matching circuit further comprises:
   a second tuning cell connected to the fourth terminal of the second element and the RF circuit, and comprising a third tuning element, a fourth tuning element and a second control element, wherein the second control element determines whether to make a second node connected between the third and fourth tuning elements couple to the voltage level according to a second control signal.

7. The electronic device as claimed in claim 6, wherein the selecting circuit is further configured to generate the second control signal so as to adjust the variable impedance.

8. The electronic device as claimed in claim 6, wherein the third and fourth tuning elements are inductors.

9. The electronic device as claimed in claim 8, wherein the second control element comprises:
   a second RF chock inductor coupled to the second node and receiving the second control signal; and
   a second diode having a second anode coupled to the second node and a second cathode coupled to the voltage level.

10. The electronic device as claimed in claim 9, wherein inductance of the second RF chock inductor is greater than 33 nH.

11. The electronic device as claimed in claim 9, wherein the second control element further comprises a blocking capacitor having one terminal connected to the second node and the other terminal connected to the RF chock inductor and the second anode of the second diode.

12. The electronic device as claimed in claim 1, wherein the first element is a inductor and the second element is a capacitor.

13. The electronic device as claimed in claim 1, wherein the first frequency band is approximately from 1.71 GHz to 1.88 GHz, and the second frequency band is approximately from 1.92 GHz to 2.17 GHz.

14. A matching circuit for providing variable impedance between an antenna and a RF circuit, comprising:
   a first element having a first terminal and a second terminal, wherein the first terminal is coupled to the antenna;
   a second element having a third terminal connected to the second terminal of the first element and a fourth terminal coupled to the RF circuit;
   a first tuning cell connected to the second terminal of the first element and the third terminal of the second element, and comprising a first tuning element, a second tuning element and a first control element, wherein the first control element determines whether to make a first node connected between the first and second tuning elements couple to a voltage level according to a first control signal; and
   a selecting circuit coupled to the first control element and configured to generate the first control signal so as to adjust the variable impedance.

15. The matching circuit as claimed in claim 14, wherein the first and second tuning elements are capacitors.

16. The matching circuit as claimed in claim 14, wherein the first control element comprises:
   a first RF chock inductor coupled to the first node, and receiving the first control signal; and
   a first diode having a first anode coupled to the first node and a first cathode coupled to the voltage level.

17. The matching circuit as claimed in claim 16, wherein inductance of the first RF chock inductor is greater than 33 nH.

18. The matching circuit as claimed in claim 14, wherein the voltage level is a ground voltage.

19. The matching circuit as claimed in claim 14, further comprising:
   a second tuning cell connected to the fourth terminal of the second element, and comprising a third tuning element, a fourth tuning elements and a second control element, wherein the second control element determines whether to make a second node connected between the third and fourth tuning elements couple to the voltage level according to a second control signal.

20. The matching circuit as claimed in claim 19, wherein the selecting circuit is further configured to generate the second control signal so as to adjust the variable impedance.

21. The matching circuit as claimed in claim 19, wherein the third and fourth tuning elements are inductors.

22. The matching circuit as claimed in claim 21, wherein the second control element comprises:
   a second RF chock inductor coupled to the second node, and receiving the second control signal; and
   a second diode having a second anode coupled to the second node and a second cathode coupled to the voltage level.

23. The matching circuit as claimed in claim 22, wherein inductance of the second RF chock inductor is greater than 33 nH.

24. The electronic device as claimed in claim 22, wherein the second control element further comprises a blocking capacitor having one terminal connected to the second node and the other terminal connected to the RF chock inductor and the second anode of the second diode.

25. The matching circuit as claimed in claim 14, wherein the first element is a inductor and the second element is a capacitor.

* * * * *